United States Patent
Tomita et al.

(10) Patent No.: US 8,961,696 B2
(45) Date of Patent: Feb. 24, 2015

(54) METHOD AND DEVICE FOR CLEANING SEMICONDUCTOR SUBSTRATE

(75) Inventors: Hiroshi Tomita, Yokohama (JP); Minako Inukai, Yokohama (JP); Hiaashi Okuchi, Yokohama (JP); Linan Ji, Shanghai (CN)

(73) Assignee: Kabushiki Kaisha Toshiba, Tokyo (JP)

( * ) Notice: Subject to any disclaimer, the term of this patent is extended or adjusted under 35 U.S.C. 154(b) by 170 days.

(21) Appl. No.: 13/423,583

(22) Filed: Mar. 19, 2012

(65) Prior Publication Data

US 2013/0068257 A1    Mar. 21, 2013

(30) Foreign Application Priority Data

Sep. 21, 2011    (JP) .................. 2011-206009

(51) Int. Cl.
  *B08B 7/00*    (2006.01)
  *H01L 21/67*    (2006.01)
  *H01L 21/02*    (2006.01)

(52) U.S. Cl.
  CPC .... *H01L 21/67005* (2013.01); *H01L 21/67028* (2013.01); *H01L 21/02057* (2013.01)
  USPC .................... 134/19; 134/5; 134/17

(58) Field of Classification Search
  CPC .................. H01L 21/02054; H01L 21/02057
  See application file for complete search history.

(56) References Cited

U.S. PATENT DOCUMENTS 4,777,804 A    10/1988    Bowling et al.

FOREIGN PATENT DOCUMENTS

| EP | 423761 A2 * | 4/1991 |
| JP | 03-145130 | 6/1991 |
| JP | 2005-19787 | 1/2005 |
| JP | 2008-243981 | 10/2008 |

OTHER PUBLICATIONS

English machine translation of JP 2008 243981.*
Notification of Reason for Rejection issued by the Japanese Patent Office on Jan. 17, 2014, for Japanese Patent Application No. 2011-206009, and English-language translation thereof.

* cited by examiner

*Primary Examiner* — Eric Golightly
(74) *Attorney, Agent, or Firm* — Finnegan, Henderson, Farabow, Garrett & Dunner, L.L.P.

(57) ABSTRACT

According to one embodiment, a method for cleaning a semiconductor substrate comprises supplying water vapor to a surface of a semiconductor substrate on which a concave-convex pattern is formed while heating the semiconductor substrate at a predetermined temperature, cooling the semiconductor substrate after stopping the heating and the supply of the water vapor and freezing water on the semiconductor substrate, after freezing the water, supplying pure water onto the semiconductor substrate and melting a frozen film, and after melting the frozen film, drying the semiconductor substrate.

7 Claims, 6 Drawing Sheets

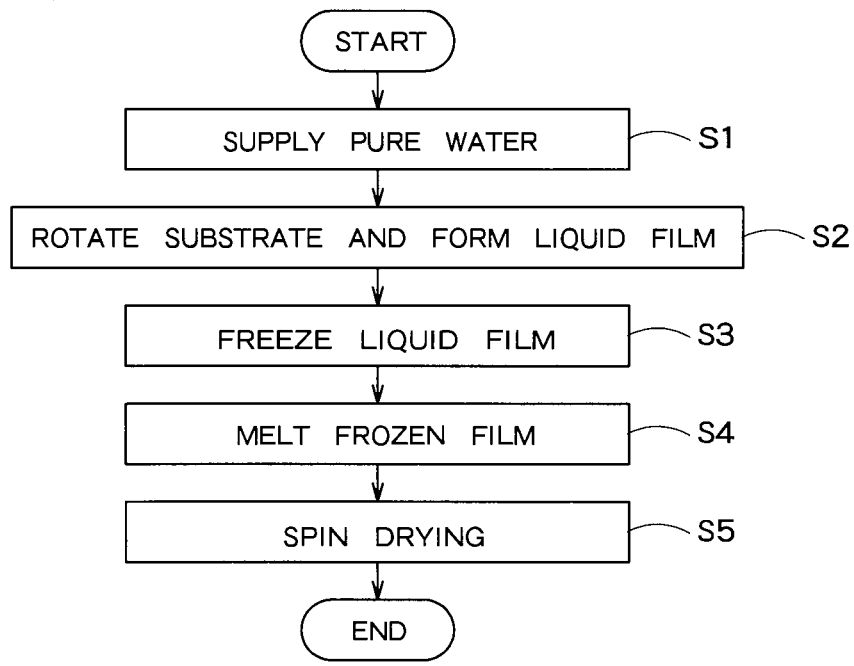
F I G. 1
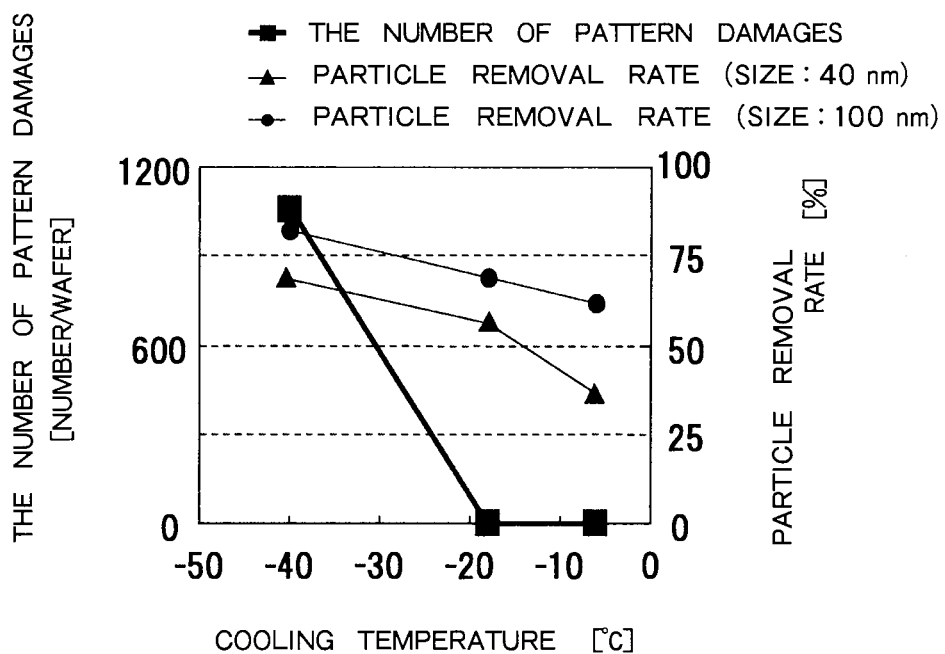
F I G. 2

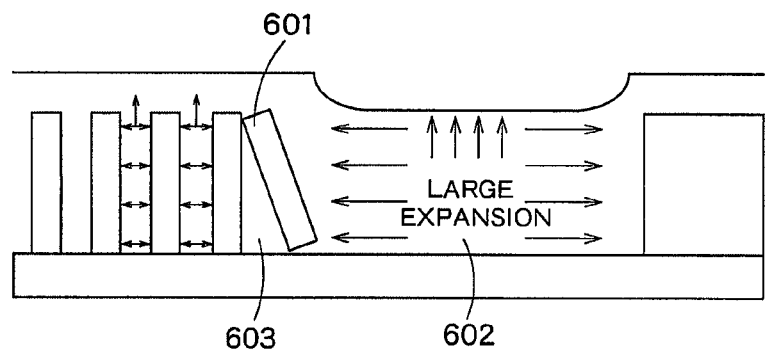
F I G. 4
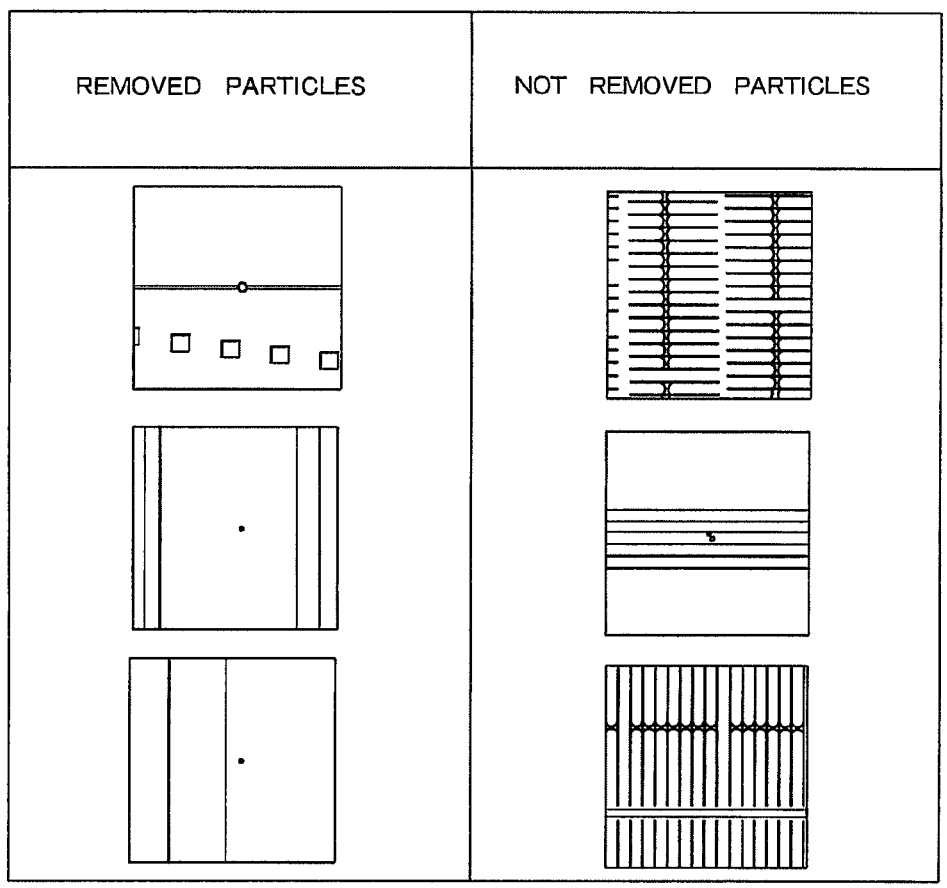
F I G. 5

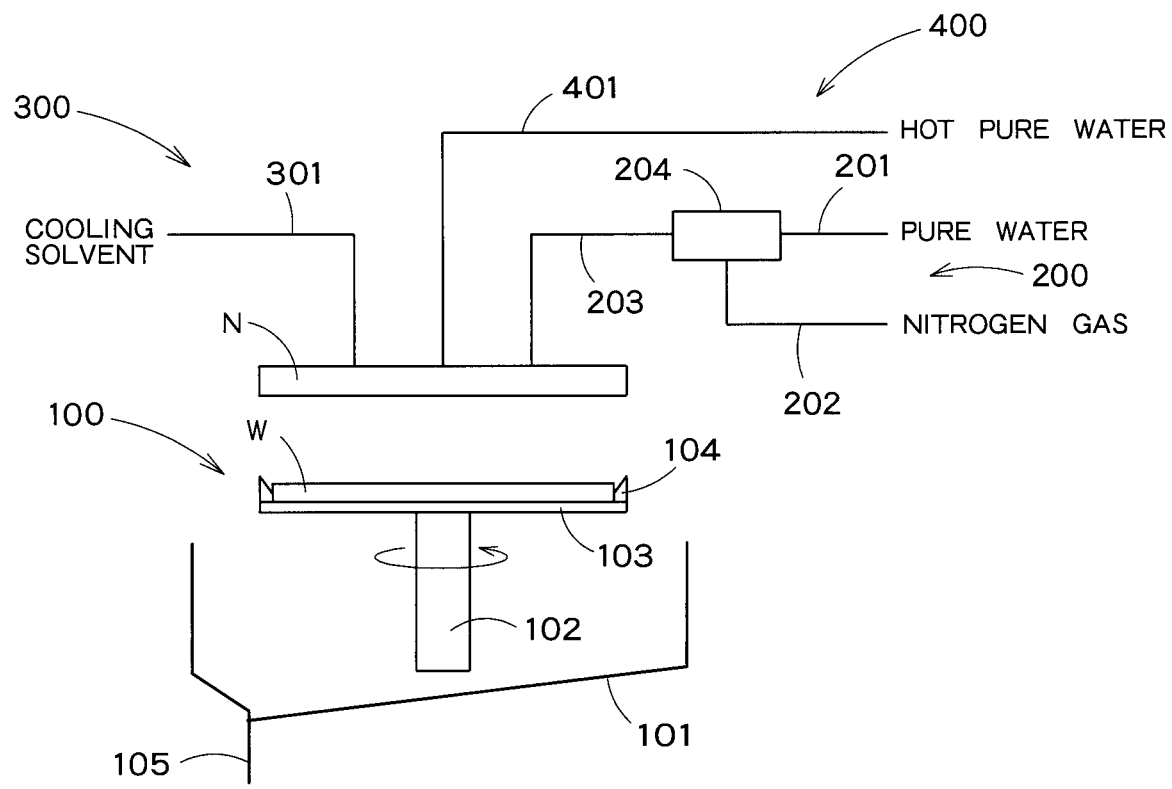
F I G. 7
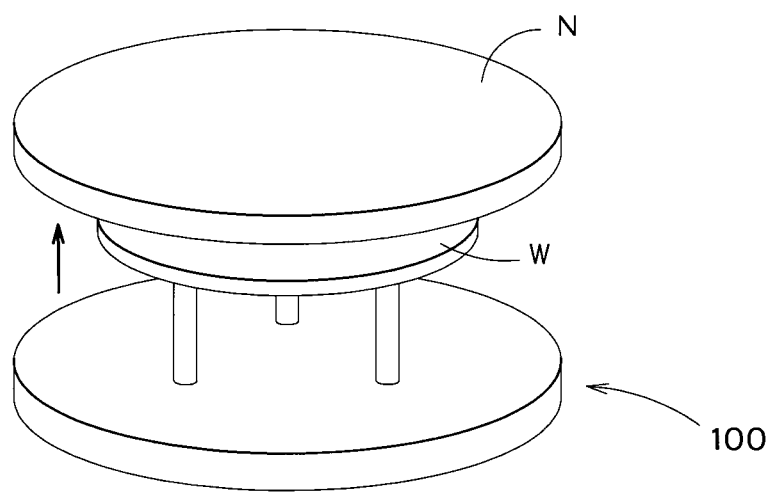
F I G. 8

METHOD AND DEVICE FOR CLEANING SEMICONDUCTOR SUBSTRATE

CROSS REFERENCE TO RELATED APPLICATION

This application is based upon and claims benefit of priority from the Japanese Patent Application No. 2011-206009, filed on Sep. 21, 2011, the entire contents of which are incorporated herein by reference.

FIELD

Embodiments described herein relate generally to a method and a device for cleaning a semiconductor substrate.

BACKGROUND

With increasing miniaturization of device pattern due to advancements in semiconductor manufacturing technologies, a cleaning technique for removing minute contaminant particles from semiconductor substrate is desired.

A conventional two-fluid jet cleaning device used as a single wafer cleaning device removes particles by rotating a wet semiconductor substrate and spraying mist-like droplets (droplet mist) generated by mixing gas such as dry air or nitrogen and liquid such as pure water to the surface of the semiconductor substrate.

A freeze cleaning process is known as a method for removing particles on a semiconductor substrate. In a conventional freeze cleaning process, first, pure water is supplied on a semiconductor substrate and a part of the pure water is splashed out of the substrate by rotating the semiconductor substrate, so that a liquid film (water film) is formed on the semiconductor substrate. Then, coolant gas is discharged to the semiconductor substrate to freeze the liquid film and particles are captured by a frozen film (ice film) by using volume expansion force generated when the phase of the liquid film changes from liquid to solid. Thereafter, pure water is supplied to the semiconductor substrate to melt the frozen film and the particles are discharged from the semiconductor substrate along with the pure water.

However, in such a conventional freeze cleaning process, there is a problem that fine patterns on the semiconductor substrate are damaged by the volume expansion force of the liquid.

BRIEF DESCRIPTION OF THE DRAWINGS

FIG. 1 is a flowchart for explaining a freeze cleaning process by a comparative example;

FIG. 2 is a graph showing a relationship among a particle removal rate, the number of pattern damages, and cooling temperature in the comparative example;

FIG. 4 is a diagram for explaining forces applied to a pattern in the comparative example;

FIG. 5 is a diagram showing removal tendencies of particles in the comparative example;

FIG. 7 is a schematic configuration diagram of a cleaning device for semiconductor substrate according to an embodiment of the present invention;

FIG. 8 is a schematic configuration diagram of a holding heating unit according to a modified example;

DETAILED DESCRIPTION

According to one embodiment, a method for cleaning a semiconductor substrate comprises supplying water vapor to a surface of a semiconductor substrate on which a concave-convex pattern is formed while heating the semiconductor substrate at a predetermined temperature, cooling the semiconductor substrate after stopping the heating and the supply of the water vapor and freezing water on the semiconductor substrate, after freezing the water, supplying pure water onto the semiconductor substrate and melting a frozen film, and after melting the frozen film, drying the semiconductor substrate.

Prior to the description of an embodiment of the present invention, the circumstances how the inventors came up with the invention will be described. FIG. 1 is a flowchart for explaining a freeze cleaning process by a comparative example. In the freeze cleaning process by the comparative example, first, pure water is supplied on a semiconductor substrate (step S1) and a part of the pure water is splashed out of the substrate by rotating the semiconductor substrate, so that a thin liquid film (water film) is formed on a surface of the semiconductor substrate (step S2). Next, coolant gas is discharged to the semiconductor substrate to freeze the liquid film and a particle is captured by a frozen film (ice film) by using volume expansion force generated when the phase of the liquid film changes from liquid to solid (step S3). Then, pure water is supplied to the semiconductor substrate to melt the frozen film (step S4) and the particle is discharged from the semiconductor substrate along with the pure water by spin-drying (step S5).

FIG. 2 is a graph showing a relationship among a particle removal rate, the number of pattern damages in a device pattern having a fine concave-convex structure, and cooling temperature in step S3 when the freeze cleaning process described above is performed. As shown in FIG. 2, the lower the freezing temperature, the higher the particle removal rate. This is because when the freezing temperature is lowered, ice crystals grow and the volume expansion rate increases. However, as shown in FIG. 2, as the freezing temperature is lowered, the number of pattern damages increases. Therefore, in the freeze cleaning process as shown in FIG. 1, it is found that the particle removal rate cannot be improved while the fine concave-convex pattern is prevented from being damaged.

Figure 3:
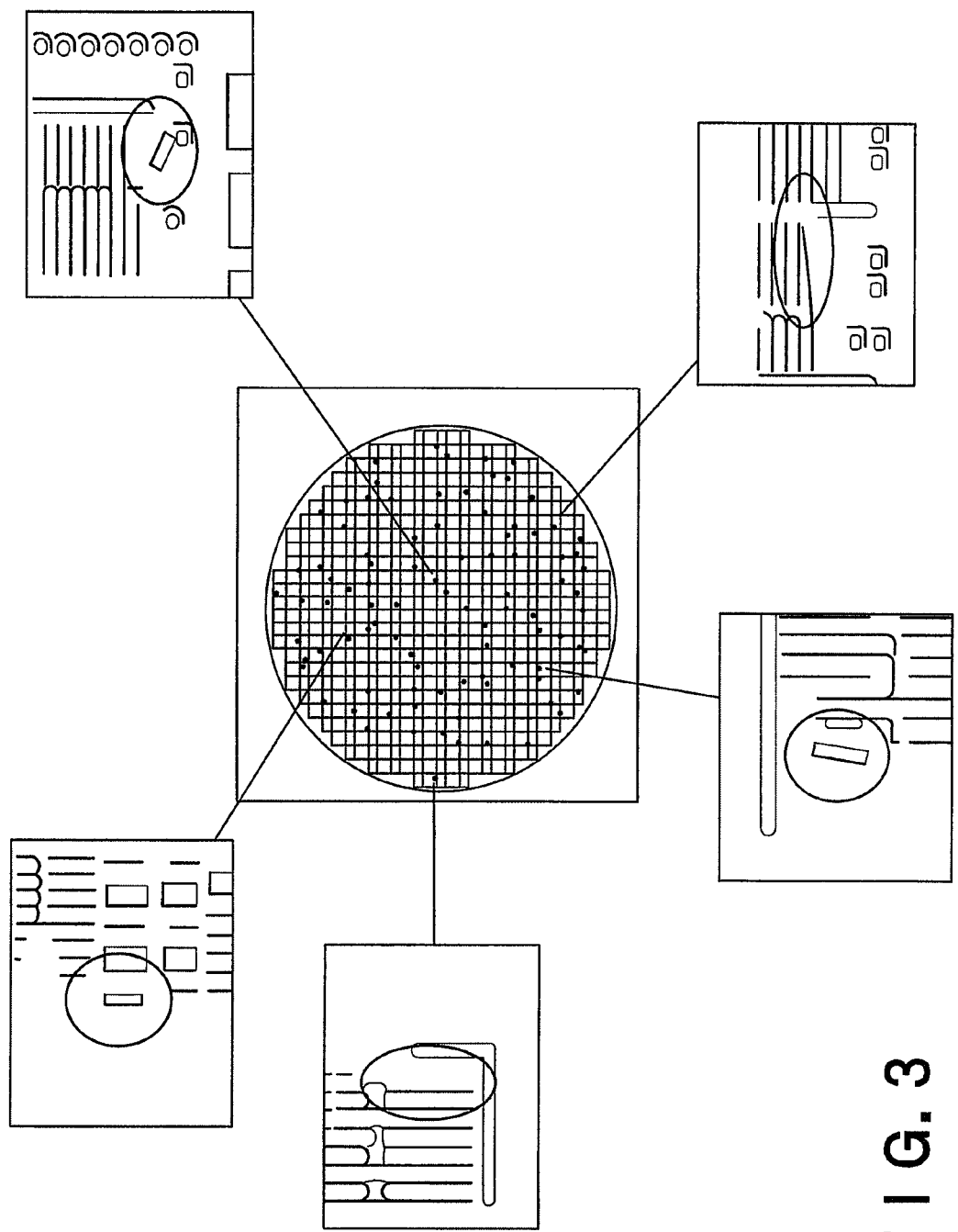
FIG. 3 is a diagram showing portions of pattern damage in the comparative example.

The inventors closely investigated generation status of the pattern damages to solve the problem of the pattern damages described above. FIG. 3 shows a map indicating defective portions in which pattern collapse occurs in a 300 mm wafer and SEM (scanning-type electron microscope) photographs of the collapsed and damaged patterns. As seen from the SEM images, the portions in which pattern damage (error) is shown are almost convex portions at an end of a dense pattern and there is a wide concave portion next to the convex portion.

As shown in FIG. 4, a convex portion 601 at an end of a dense pattern is located between a wide concave portion 602 and a narrow concave portion 603 in the dense pattern. The concave portion 602 and the concave portion 603 have different amounts of water to be frozen, so that it can be said that they have different volume expansion amounts of ice when the water is frozen. Therefore, the volume expansion amount of ice formed in the concave portion 602 increases, so that it can be said that a strong force is applied to the convex portion 601 to collapse the convex portion 601 and damage occurs. To prevent such pattern damage from occurring, it is required to reduce the amount of water frozen in the concave portion.

Figure 6C:
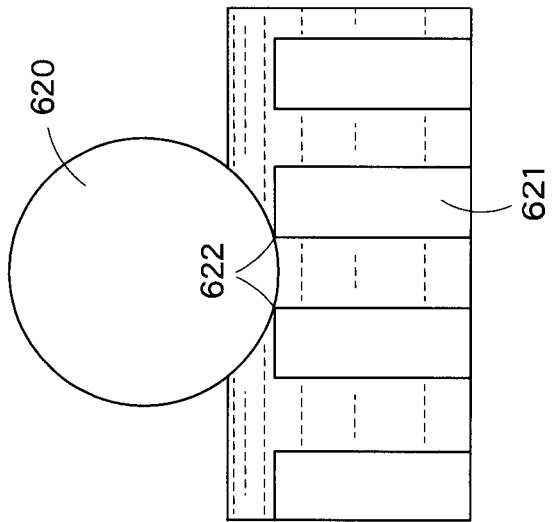
FIG. 6C is a vertical cross-sectional view showing a particle attached to convex portions in the comparative example.
Figure 6D:
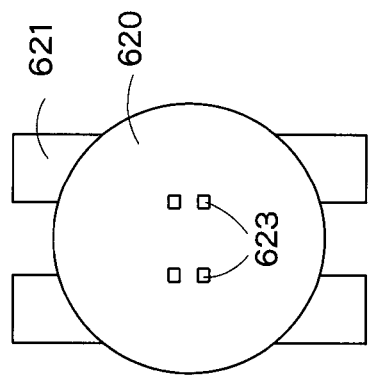
FIG. 6D is a top view showing a particle attached to convex portions in the comparative example.
Figure 6A:
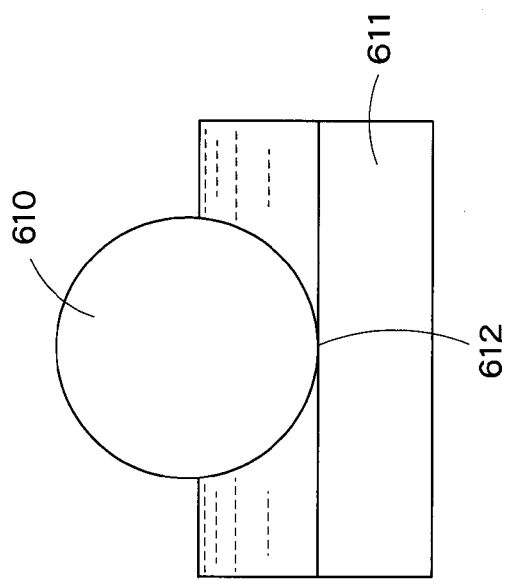
FIG. 6A is a vertical cross-sectional view showing a particle attached to a planar portion in the comparative example.
Figure 6B:
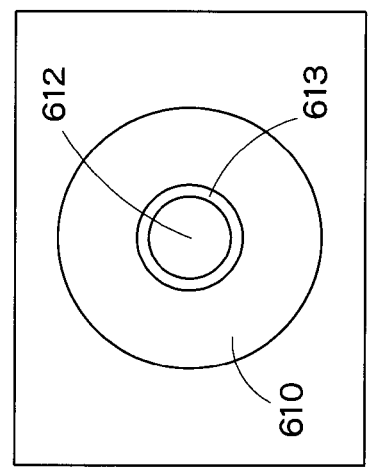
FIG. 6B is a top view showing a particle attached to a planar portion in the comparative example.

Further the inventors systematically investigated particles that were removed and particles that were not removed when the freeze cleaning process described above was performed. As shown in FIG. 5, the particles that were removed did not tend to be attached to a dense pattern portion, but tended to be attached to a planar portion. On the other hand, the particles that were not removed tended to be attached to convex portions In which fine patterns were densely located. There are characteristics that the removal tendency of particle is different depending on a portion where the particle is attached. It is considered that this is caused by the difference of the volume expansion force of the water when the water is frozen, which is applied to the particle. As shown in FIG. 6B, a particle 610 attached to a planar portion 611 as shown in FIG. 6A receives a volume expansion force of the water when the water is frozen at a circle portion 613 around a contact point 612 that is in contact with the planar portion 611. On the other hand, as shown in FIG. 6D, a particle 620 attached to convex portions 621 as shown in FIG. 6C receives a volume expansion force of the water when the water is frozen at very small points 623 near contact points 622 between the particle 620 and the convex portions 621. It is considered that the particle 620 is difficult to be removed because the volume expansion force which the particle 620 on the convex portions 621 receives is small. FIGS. 6A and 6C are vertical cross-sectional views. FIGS. 6B and 6D are top views.

The embodiment described below can solve the above problem. Hereinafter, the embodiment of the present invention will be described with reference to the drawings.

FIG. 7 shows a schematic configuration of a cleaning device for semiconductor substrate according to the embodiment of the present invention. The cleaning device includes a holding heating unit 100, a vapor supply unit 200, a cooling unit 300, and a hot water supply unit 400.

The holding heating unit 100 includes a spin cup 101, a rotation shaft 102, a spin base 103, chuck pins 104, and a heater 110. The rotation shaft 102 extends in a substantially vertical direction. The spin base 103 having a disk shape is attached to the upper end of the rotation shaft 102. The rotation shaft 102 and the spin base 103 can be rotated by a motor not shown in FIG. 7.

The chuck pins 104 are provided on a circumferential portion of the spin base 103. The chuck pins 104 sandwiches a substrate (wafer) W, so that the holding heating unit 100 can hold the substrate W substantially horizontally and rotate the substrate W.

When hot pure water is supplied from the hot water supply unit 400 to an area near the rotation center of the surface of the substrate W, the liquid spreads in radial directions of the substrate W. The holding heating unit 100 can spin-dry the substrate W. Useless liquid scattering in the radial directions of the substrate W is captured by the spin cup 101 and discharged through a waste liquid pipe 105.

The heater 110 can heat the substrate W to a desired temperature. As the heater 110, for example, a heating stage of resistance heating type, which is integrated into the spin base 103, can be used. The heater 110 only has to maintain the substrate W at a constant temperature. The heater 110 has not necessarily to be integrated into the spin base 103. The heater 110 may be a heating mechanism that supplies hot water or the like.

The vapor supply unit 200 supplies vapor to the substrate W held by the holding heating unit 100. The vapor supply unit 200 has pipes 201 to 203 and a vaporizer 204. The vaporizer 204 vaporizes pure water supplied through the pipe 201 by using carrier gas supplied through the pipe 202 and generates water vapor. The carrier gas is, for example, nitrogen. The water vapor generated by the vaporizer 204 is supplied to the substrate W from a nozzle N through the pipe 203.

The cooling unit 300 has a pipe 301 for supplying a cooling solvent such as liquid nitrogen. The cooling solvent is supplied from the nozzle N to the substrate W. The cooling unit 300 may use cooling gas such as liquid nitrogen or may perform indirect cooling using a liquid refrigerant.

The hot water supply unit 400 has a pipe 401 for supplying hot pure water. The hot pure water is supplied from the nozzle N to the substrate W. The hot pure water is, for example, pure water of about 50° C. The hot water supply unit 400 may supply not only the hot pure water, but also pure water of room temperature.

The holding heating unit 100 and the nozzle N are provided in a process chamber not shown in FIG. 7.

Although the cleaning device shown in FIG. 7 has a configuration in which the water vapor, the cooling solvent, and the hot pure water are supplied from the same nozzle N, the cleaning device may have three nozzles so that the water vapor, the cooling solvent, and the hot pure water are supplied from the three nozzles respectively, or may have two nozzles so that the water vapor and the hot pure water are supplied from one nozzle and the cooling solvent is supplied from the other nozzle.

As shown in FIG. 8, the holding heating unit 100 may be provided with a function for lifting the substrate W, and when supplying the cooling solvent to the substrate W, the substrate W may be lifted and located near the nozzle N.

Figure 9:
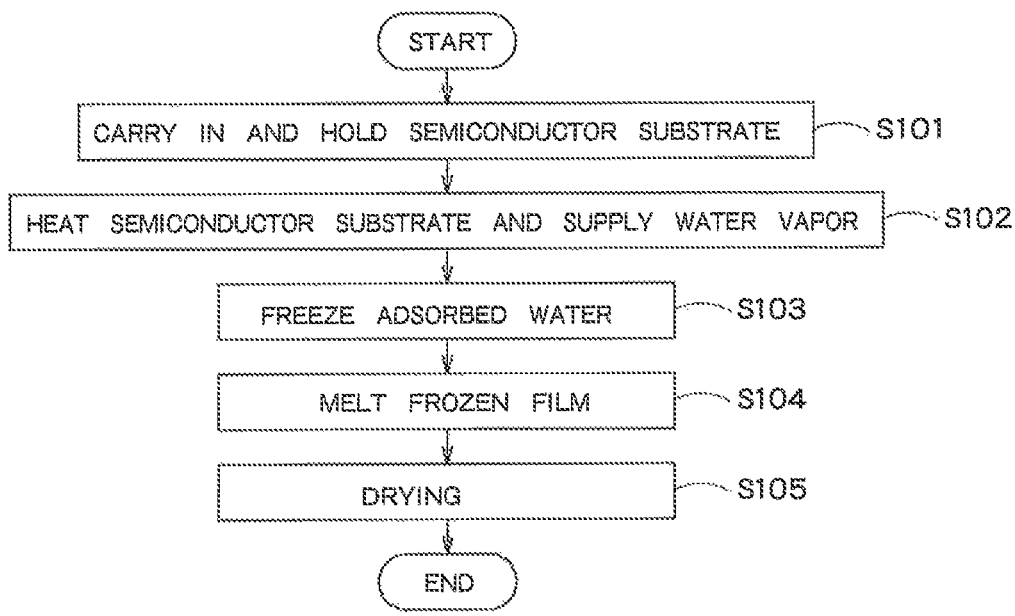
FIG. 9 is a flowchart for explaining a method for cleaning a semiconductor substrate according the embodiment.

A method for cleaning a semiconductor substrate by using such a cleaning device will be described using a flowchart shown in FIG. 9. Operations of the holding heating unit 100, the vapor supply unit 200, the cooling unit 300, and the hot water supply unit 400 can be controlled by a control unit not shown in the drawings.

(Step S101) The semiconductor substrate W on which a concave-convex pattern is formed is carried in by a conveying unit (not shown in the drawings) and held by the holding heating unit 100. The concave-convex pattern is formed by, for example, an RIE (Reactive Ion Etching) method and there are particles such as process residues on the semiconductor substrate W.

(Step S102) While the semiconductor substrate W is heated using the heater 110, water vapor is supplied from the vapor supply unit 200 to the surface of the semiconductor substrate W. The process chamber is filled with a humidified atmosphere and water is adsorbed onto the surface of the semiconductor substrate W. The semiconductor substrate W is maintained at a predetermined temperature by the heater 110. Under such an environment, water vapor is in an equilibrium state between adsorption and desorption on the semiconductor substrate W, so that the water vapor cannot be adsorbed onto the semiconductor substrate W exceeding the saturated water vapor concentration. At room temperature, the water vapor supplied to the semiconductor substrate W is condensed in the concave-convex pattern on the semiconductor substrate W and a liquid film is formed, so that the heater 110 is controlled to maintain the surface temperature of the semiconductor substrate W between 40° C. and 80° C. and the amount of adsorbed water is adjusted. Thereby, an adsorbed water layer suited to the freeze cleaning process is formed on the surface of the semiconductor substrate W.

In the concave-convex pattern on the semiconductor substrate W, various types of films, such as a CVD-$SiO_2$ film, a coated $SiO_2$ film, a CVD-SIN film, a polysilicon film, a boron-doped polysilicon film, a tungsten film, are mixed, so that the amount of adsorbed water varies depending on presence or absence of reaction (for example, hydrogen bonding reaction) with the water adsorbed onto the surface. Therefore, the surface temperature of the semiconductor substrate W needs to be adjusted according to the state of the concave-convex pattern and the state of films exposed on the surface.

(Step S103) The supply of water vapor from the vapor supply unit 200 and the heating by the heater 110 are stopped. Immediately after the heating is stopped, a cooling solvent is supplied to the surface of the semiconductor substrate W from the cooling unit 300 and the water adsorbed onto the surface of the semiconductor substrate W is frozen. It is possible to separate a particle from the semiconductor substrate W at a portion where the particle is in contact with the semiconductor substrate W by using a volume expansion force generated when the phase of the water on the semiconductor substrate W changes from liquid to solid. In this step, only the water adsorbed onto the surface of the semiconductor substrate W and the water adsorbed onto the surface of the particle are frozen, so that the water that covers the entire concave pattern is not frozen. The surface of the semiconductor substrate W is cooled to, for example, −40° C. or lower.

(Step S104) The hot water supply unit 400 supplies hot pure water to an area near the rotation center of the surface of the semiconductor substrate W and the holding heating unit 100 rotates the semiconductor substrate W. The hot pure water receives centrifugal force generated by the rotation of the semiconductor substrate W and spreads over the entire surface of the semiconductor substrate W. Thereby, the frozen film melts. After supplying the hot pure water, pure water at room temperature may be supplied onto the semiconductor substrate W.

(Step S105) A drying process of the semiconductor substrate W is performed. For example, the rotation speed of the semiconductor substrate W is raised to a predetermined spin-dry rotation speed to perform a spin-dry process in which the pure water remaining on the surface of the semiconductor substrate W is thrown out and the semiconductor substrate W is dried. The particles on the semiconductor substrate W are removed from the semiconductor substrate W along with the pure water and the frozen film melted in step S104.

Figures 10A, 10B:
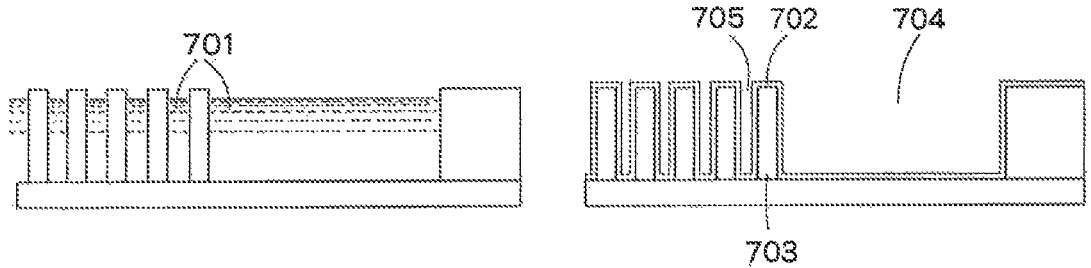
FIG. 10A is a diagram showing a liquid film formed on a substrate by the freeze cleaning process of the comparative example.
FIG. 10B is a diagram showing an adsorbed water layer formed on the substrate by the cleaning method of the embodiment.

In the freeze cleaning process by the comparative example shown in FIG. 1, liquid water is supplied onto the semiconductor substrate, the amount of water on the semiconductor substrate is gradually reduced by rotating the semiconductor substrate, and a liquid film is formed. In this method, when reducing the amount of water on the semiconductor substrate, water in concave portions in the concave-convex pattern cannot be removed, so that, as shown in FIG. 10A, a liquid film 701, in which the concave-convex pattern is filled with water, is formed.

On the other hand, in the present embodiment, in step S102, instead of supplying the liquid water, under a humidified atmosphere, an adsorbed water layer is formed on the surface of the semiconductor substrate W by gradually increasing an amount of adsorbed water to an equilibrium state between adsorption and desorption of the water based on the temperature of the surface of the semiconductor substrate W and the material of the concave-convex pattern. Therefore, as shown in FIG. 10B, it is possible to form an adsorbed water layer 702 in which the water is adsorbed only onto the surface of the concave-convex pattern, so that it is possible to reduce the amount of water frozen in the concave portion in the freezing process in step S103.

In this way, a state is formed in which the concave-convex pattern is not filled with water, so that, even if the freezing temperature is lowered, it is possible to extremely reduce a force which is generated by a difference between the volume expansion amounts of ices frozen in the concave portion 704 and the concave portion 705 and which is applied to a convex portion 703 located at an end of a dense pattern and between a wide concave portion 704 and a narrow concave portion 705 of the dense pattern. Therefore, it is possible to prevent damage from occurring.

Figure 11:
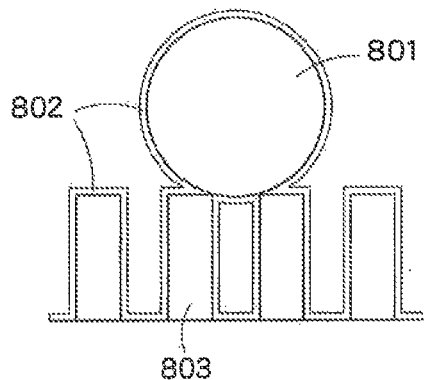
FIG. 11 is a diagram showing an adsorbed water layer formed on a surface of a particle on a convex pattern.

Further, according to the cleaning method of the present embodiment, as shown in FIG. 11, it is also possible to form an adsorbed water layer 802 on the surface of a particle 801 on a convex pattern 803. Therefore, when the water is frozen, a sufficient volume expansion force can be obtained, so that it is possible to easily discharge the particle 801 along with the melted pure water from the semiconductor substrate by melting and spin-drying the frozen film. Therefore, the particle removal rate can be improved.

As described above, according to the present embodiment, it is possible to effectively remove the particles on the semiconductor substrate by the freeze cleaning while preventing damage from being applied to the fine patterns.

In the above embodiment, IPA (isopropyl alcohol) may be added to the pure water supplied to the vaporizer 204 through the pipe 201 so that the concentration is about 5 to 30 wt %. Thereby, the surface tension is reduced and the adsorbed water infiltrates immediately below the particles, so that it is possible to further improve the particle removal rate. Note that when the concentration of the IPA is raised higher than the above-mentioned concentration, the surface tension is further reduced, and there is a risk that the amount of frozen water decreases and the particle removal rate degrades.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:
1. A method for cleaning a semiconductor substrate, comprising:
supplying water vapor to a surface of a semiconductor substrate on which a concave-convex pattern is formed while heating the semiconductor substrate at a predetermined temperature, to form an adsorbed water layer;
stopping the heating and the supply of the water vapor so that the surface of the adsorbed water layer has a concave and convex pattern matching the concave-convex pattern formed on the surface of the semiconductor sub- strate, and subsequently cooling the semiconductor substrate to freeze water on the semiconductor substrate;

after freezing the water, supplying pure water onto the semiconductor substrate and melting a frozen film; and after melting the frozen film, drying the semiconductor substrate.

2. The method for cleaning a semiconductor substrate according to claim 1, wherein the water vapor includes isopropyl alcohol.

3. The method for cleaning a semiconductor substrate according to claim 2, wherein concentration of the isopropyl alcohol is 5 to 30 wt %.

4. The method for cleaning a semiconductor substrate according to claim 1, wherein the semiconductor substrate is cooled to −40° C. or lower to freeze water on the semiconductor substrate.

5. The method for cleaning a semiconductor substrate according to claim 1, wherein an adsorbed water layer is formed on a surface of a particle on a convex pattern by supplying the water vapor.

6. The method for cleaning a semiconductor substrate according to claim 1, wherein the water vapor is supplied while the semiconductor substrate is being heated so that a surface temperature of the semiconductor substrate is 40° C. to 80° C.

7. The method for cleaning a semiconductor substrate according to claim 1, wherein a convex portion of the concave-convex pattern is formed between a wide concave portion and a narrow concave portion.

\* \* \* \* \*

UNITED STATES PATENT AND TRADEMARK OFFICE
CERTIFICATE OF CORRECTION

PATENT NO. : 8,961,696 B2  
APPLICATION NO. : 13/423583  
DATED : February 24, 2015  
INVENTOR(S) : Tomita et al.

It is certified that error appears in the above-identified patent and that said Letters Patent is hereby corrected as shown below:

Title page, item (75), in the Inventors, line 3, change "Hiaashi" to --Hisashi--.

Signed and Sealed this
Twenty-third Day of June, 2015

Michelle K. Lee
*Director of the United States Patent and Trademark Office*